United States Patent

Kudo et al.

[11] Patent Number: 5,994,027
[45] Date of Patent: Nov. 30, 1999

[54] PHOTORESIST LAYER SUPPORTING FILM AND PHOTORESIST FILM LAMINATE

[75] Inventors: Takafumi Kudo; Tetsuo Yoshida; Yukihiko Minamihira, all of Sagamihara; Kazutaka Masaoka, Hitachi; Youji Tanaka, Hitachi; Noriyo Kimura, Hitachi, all of Japan

[73] Assignee: Teijin Limited, Osaka, Japan

[21] Appl. No.: 08/855,468

[22] Filed: May 13, 1997

[30] Foreign Application Priority Data

May 20, 1996 [JP] Japan .................................. 8-124576
May 20, 1996 [JP] Japan .................................. 8-124577

[51] Int. Cl.⁶ .................................................. G03C 1/795
[52] U.S. Cl. ................................... 430/273.1; 430/275.1; 430/277.1; 430/278.1; 430/533
[58] Field of Search .............................. 430/273.1, 275.1, 430/277.1, 278.1, 533, 939

[56] References Cited

U.S. PATENT DOCUMENTS

| | | | |
|---|---|---|---|
| 4,302,268 | 11/1981 | Tachiki et al. | 156/238 |
| 5,179,854 | 1/1993 | Matsui et al. | 72/349 |
| 5,384,354 | 1/1995 | Hasegawa et al. | 524/539 |
| 5,618,621 | 4/1997 | Hasegawa et al. | 428/343 |

FOREIGN PATENT DOCUMENTS

| | | | |
|---|---|---|---|
| A10576682 | 1/1994 | European Pat. Off. | C08J 5/18 |
| 0685509 | 12/1995 | European Pat. Off. | C08J 5/18 |
| 9096907 | 4/1997 | Japan . | |

*Primary Examiner*—Bernard Codd
*Attorney, Agent, or Firm*—Sughrue, Mion, Zinn, Macpeak & Seas, PLLC

[57] ABSTRACT

A photoresist layer supporting film is (A) formed from a polymer composition comprising (i) 55 to 100% by weight of a copolyester containing ethylene terephthalate units as a main recurring unit and having a melting point of 210 to 250° C. and (ii) 0 to 45% by weight of polybutylene terephthalate or a copolyester containing butylene terephthalate units as a main recurring unit and having a melting point of not lower than 180° C. and (B) has a plane orientation coefficient of 0.08 to 0.16. Since this supporting film is excellent in substrate shape follow-up properties and resolution, it is suitable for the preparation of a photoresist film laminate by laminating a protective film and a photoresist layer on the surface thereof.

14 Claims, No Drawings

PHOTORESIST LAYER SUPPORTING FILM AND PHOTORESIST FILM LAMINATE

FIELD OF THE INVENTION

This invention relates to a photoresist layer supporting film and a photoresist film laminate. More specifically, it relates to a photoresist layer supporting film having excellent flexibility which can fit the unevenness of the print circuit surface (hereinafter to be referred to as simply "flexibility" sometimes) and resolution; and to a photoresist film laminate using the same.

PRIOR ART

A photoresist has been and is widely used in the production of a printed circuit board or the like. As the photoresist is generally used a laminated structure consisting of a supporting layer, a photoresist layer and a protective layer. As this supporting layer is mainly used a polyester film which is excellent in mechanical properties, optical properties, chemical resistance, dimensional stability, flatness and the like. The photoresist is a layer of a photosensitive resin. As the protective layer is used a polyethylene film or a polyester film.

Brief explanation will be made on an application method of the photoresist laminated structure hereinbelow. From the laminated structure consisting of a supporting layer, a photoresist layer and a protective layer, the protective layer is first removed and the exposed photoresist layer is joined to a conductive base material laminated on a substrate. The conductive base material is generally a copper sheet. Thereafter, a glass sheet having a printed circuit is joined to the photoresist supporting layer and then illuminated with light from the side of the glass sheet. Light passes through transparent portions of an image of the circuit printed on the glass sheet and only exposed portions of the photosensitive resin of the photoresist layer reacts. The glass sheet and the supporting layer are then removed and unexposed portions of the photoresist layer are removed by using an appropriate solvent or the like. Then, when etching is performed using an acid or the like, the conductive base material exposed by removal of unexposed portions of the photoresist layer is removed. Thereafter, when the exposed and reacted photoresist layer is removed by an appropriate method, the remaining conductive base material layer is formed as a circuit pattern on the substrate.

However, in recent years, a step (so-called "circuit lamination") is frequently conducted in which an insulating layer is formed on an existing circuit of a conductive base material layer formed on the substrate and then another circuit of a conductive base material layer is formed on this insulating layer. This circuit lamination is carried out by forming an insulating layer/conductive base material layer on a substrate having an existing circuit, laminating a photoresist layer/supporting layer on this conductive base material layer, and then forming another circuit of a conductive base material layer by the aforementioned method. However, in the lamination of circuits, the surface of the laminated insulating layer/conductive base material layer is made uneven due to the presence of uneven surface of the existing circuit. Therefore, unless the photoresist layer/supporting layer is joined to the insulating layer/conductive base material layer in such a manner that they follow the uneven surface of the insulating layer/conductive base material layer, a newly provided circuit will have partially missing portions.

On the other hand, since a circuit pattern formed of a conductive base material is becoming finer and finer and the space between circuits is becoming narrower and narrower in recent years, the higher reproducibility of image formation and higher resolution are desired. Therefore, high quality has been required for a polyester film used as the supporting layer. That is, the polyester film used as the supporting layer must have high transparency and low film haze. When a photoresist layer in a photoresist is exposed, light passes through the supporting layer as described above. Therefore, if the transparency of the supporting layer is low, such problems will arise that the photoresist layer may not be exposed sufficiently or resolution may deteriorate by the diffusion of light.

It is, therefore, a first object of the present invention to provide a photoresist film laminate suitable for forming another circuit on an existing circuit of a conductive base material layer as well as a supporting film therefor.

It is a second object of the present invention to provide a photoresist supporting film and a photoresist film laminate therefrom, which are excellent in flexibility which can fit an uneven (concavo-convex) shape and optical transmission.

It is a third object of the present invention to provide a photoresist supporting film and a photoresist film laminate therefrom, which are excellent in workability in the production of a photoresist film laminate and the preparation of a photoresist and allow to carry out stable operation.

According to studies conducted by the inventors of the present invention, it has been found that the above objects of the present invention can be attained by a photoresist layer supporting film characterized in that (A) it is formed from a polymer composition comprising (i) 55 to 100% by weight of a copolyester containing ethylene terephthalate units as a main recurring unit and having a melting point of 210 to 250° C. and (ii) 0 to 45% by weight of a copolyester containing polybutylene terephthalate or butylene terephthalate units as a main recurring unit and having a melting point of not lower than 180° C., and that (B) it has a plane orientation coefficient of 0.08 to 0.16.

The present invention is described in detail hereinafter.

The polymer composition forming the supporting film of the present invention comprises (1) only a copolyester (to be referred to as "polyester-a" hereinafter) containing ethylene terephthalate units as a main recurring unit and having a melting point of 210 to 250° C. or (2) a polyester mixture consisting of the polyester-a and polybutylene terephthalate or a copolyester (to be referred to as "polyester-b" hereinafter) containing butylene terephthalate units as a main recurring unit and having a melting point of not lower than 180° C.

A description is subsequently given of the polyester-a and the polyester-b.

The polymer composition forming the supporting film of the present invention may be the polyester-a alone. This polyester-a is a copolyester containing ethylene terephthalate units as a main recurring unit and having a melting point of 210 to 250° C. The polyester-a is obtained from terephthalic acid as an acid component, ethylene glycol as a glycol component and further a copolymer component. The copolymer component may be either an acid component or a glycol component. Illustrative examples of the acid component include aromatic dibasic acids such as isophthalic acid, phthalic acid and naphthalenedicarboxylic acid; aliphatic dicarboxylic acids such as adipic acid, azelaic acid, sebacic acid and decanedicarboxylic acid; alicyclic dicarboxylic acids such as cyclohexanedicarboxylic acid; and the the like. Illustrative examples of the glycol component include aliphatic diols such as butane diol and hexane diol;

alicyclic diols such as cyclohexane dimethanol; and the like. They may be used alone or in combination of two or more.

The copolymer component in the copolyester containing ethylene terephthalate units as a main recurring unit is used in such a proportion that the melting point of the resulting polyester-a becomes 210 to 250° C., preferably 215 to 235° C., though it differs depending on the kind of the component. If the melting point of the polyester-a is below 210° C., the crystallinity of the resulting polymer will be too small and blocking will occur in the obtained film. Therefore, it is not suitable for the production of a photoresist and is inferior in mechanical strength. On the other hand, if the melting point of the polyester-a is above 250° C., the crystallinity of the resulting polymer will be too large, whereby the flexibility will be impaired when it is used in a photoresist supporting film.

Meanwhile, the polyester-b used in the present invention is a copolyester containing polybutylene terephthalate or butylene terephthalate units as a main recurring unit and having a melting point of not lower than 180° C.

The polyester-b is obtained from terephthalic acid as an acid component and 1,4-butane diol as a glycol component and/or another copolymer component. The copolymer component used may be either an acid component or a glycol component. Illustrative examples of the acid component include aromatic dibasic acids such as isophthalic acid, phthalic acid and naphthalenedicarboxylic acid; aliphatic dicarboxylic acids such as adipic acid, azelaic acid, sebacic acid and decanedicarboxylic acid; alicyclic dicarboxylic acids such as cyclohexanedicarboxylic acid; and the the like. Illustrative examples of the glycol component include aliphatic diols such as ethylene glycol and hexane diol; alicyclic diols such as cyclohexane dimethanol; and the like. They may be used alone or in combination of two or more.

The copolymer component in the copolyester which contains butylene terephthalate units as a main recurring unit is used in such a proportion that the melting point of the resulting polyester-b becomes not lower than 180° C., preferably not lower than 200° C., more preferably not lower than 210° C., though it differs depending on the kind of the component. If the melting point of the polyester-b is below 180° C., the crystallinity of the resulting polymer will be too small and blocking will occur in the obtained film. Therefore, it is not suitable for the production of a photoresist and is inferior in mechanical strength. A polybutylene terephthalate homopolymer has a melting point of 223° C. and it is difficult to obtain a copolyester having a melting point higher than 223° C.

The melting points of the polyester-a and the polyester-b are measured, using Du Pont Instruments 910 DSC, by a method for obtaining a melting peak at a temperature elevation rate of 20° C./min. The quantity of a sample is about 20 mg.

The copolyester (polyester-a) containing ethylene terephthalate units as a main recurring unit and the copolyester (polyester-b) containing polybutylene terephthalate or butylene terephthalate units as a main recurring unit are not limited by production methods thereof.

For example, preferred production methods for the polyester-a include one in which terephthalic acid, ethylene glycol and a copolymer component are subjected to an esterification reaction and the reaction product obtained is subjected to a polycondensation reaction to obtain a copolyester and one in which dimethyl terephthalate, ethylene glycol and a copolymer component are subjected to an ester exchange reaction and the reaction product obtained is subjected to a polycondensation reaction to obtain a copolyester. In the production of the copolyesters and polybutylene terephthalate, other additives such as antioxidant, thermal stabilizer, ultraviolet absorber, antistatic agent and the like may be added as required.

The polymer composition forming the supporting film of the present invention may be the polyester-a alone or a mixture of the polyester-a and the polyester-b. In the case of the mixture, the proportion of the polyester-b is not more than 45% by weight, generally 1 to 45% by weight, preferably 2 to 40% by weight, based on the total weight of the polyester-a and the polyester-b.

When the mixture of the polyester-a and the polyester-b is used as the polymer composition, if the copolyester (polyester-b) mainly composed of polybutylene terephthalate or butylene terephthalate is contained in an amount of more than 45% by weight and the copolyester (polyester-a) mainly composed of ethylene terephthalate is contained in an amount of less than 55% by weight, the mechanical strength of the resulting film will be insufficient and pin holes will generate when the film is joined onto a substrate having an uneven surface.

The polymer composition forming the supporting film of the present invention is preferably a mixture of the polyester-a and the polyester-b rather than the polyester-a alone because it is superior in the flexibility in a photoresist.

The polymer composition of the present invention preferably contains a lubricant having an average particle size of not more than 2.5 $\mu$m. This lubricant may be either inorganic or organic, while it is preferably inorganic. Inorganic lubricants include silica, alumina, titanium dioxide, calcium carbonate, barium sulfate and the like. Organic lubricants include crosslinked polystyrene particles, silicone particles and the like. These lubricants must have an average particle size of not more than 2.5 $\mu$m, preferably 0.005 to 2.5 $\mu$m. If the average particle size is more than 2.5 $\mu$m, the transparency of the film will be impaired, so that the photoresist will not be exposed sufficiently or resolution will deteriorate.

The amount of the lubricants contained in the polymer composition is determined by winding properties of the resulting film in the production process of the film and is, for example, generally 0.001 to 0.5% by weight. The preferred amount of the lubricants, however, is different according to the average particle size of the lubricant used. Generally, it is preferred that lubricants having a large particle size are added in a small quantity and lubricants having a small particle size are added in a large quantity. For example, in the case of silica having an average particle size of 2.0 $\mu$m, it is preferably added in an amount of 0.05% by weight, while in the case of titanium dioxide having an average particle size of 0.3 $\mu$m, it is preferably added in an amount of 0.3% by weight.

The photoresist supporting film of the present invention can be produced by melt extruding the above polymer composition, forming it into a film, biaxially stretching the film and heat-setting it. In this production process, the above lubricants (such as spherical monodisperse lubricants) may be added and mixed during polymerization of the polyester-a and the polyester-b or a mixture thereof or at the time of melt extrusion.

The polyester film of the present invention is obtained by melting the lubricant-containing polymer composition, forming it into a film by extruding from a die, biaxially stretching the film and heat-setting it. The polyester film of the present invention must have a plane orientation coefficient of 0.08 to 0.16, preferably 0.10 to 0.15.

If the plane orientation coefficient is less than 0.08, the mechanical strength of the film will be insufficient and pin holes will be produced when it is joined onto a substrate having an uneven surface. On the other hand, if the plane orientation coefficient is more than 0.16, the flexibility of the film will deteriorate and a defect will be produced in the circuit.

The plane orientation coefficient is defined by the following equation.

$$f=[(nx+ny)/2]-nz$$

wherein f is a plane orientation coefficient, and nx, ny and nz are refractive indices in transverse, longitudinal and thickness directions of the film, respectively.

The refractive index is measured with an Abbe refractometer having a polarization analyzer attached to an eyepiece side thereof and using monochromatic NaD rays. Methylene iodide is used as a mount solution and the measurement temperature is 25° C.

A film having a plane orientation coefficient (f) in the above range is obtained as follows. For example, the polymer composition of the present invention is melt extruded into a sheet which is then quenched to prepare an unstretched film. This unstretched film is then biaxially stretched at a temperature of 85 to 145° C. at a stretch ratio of 2.6 to 4.0 in longitudinal and transverse directions and the biaxially oriented film is heat-set at 150 to 210° C. as required.

The above biaxial orientation may be sequential biaxial orientation that an unstretched film is stretched in a longitudinal or transverse direction to prepare a monoaxially stretched film and then the monoaxially stretched film is stretched in a transverse or longitudinal direction, or simultaneous biaxial orientation that an unstretched film is stretched in both longitudinal and transverse directions at the same time. The biaxially oriented film can be further stretched in a longitudinal direction and/or a transverse direction as required.

The polyester film of the present invention preferably has an L5 value in each of the longitudinal and transverse directions of 1 to 65 g/mm, more preferably 1 to 55 g/mm. Particularly, the average L5 values of these longitudinal and transverse directions are preferably 1 to 45 g/mm. When the L5 values of the film in both longitudinal and transverse directions are within the above range, advantageously, no partial defect is produced in a newly provided circuit in the lamination of circuits because a photoresist film is joined in a shape that follows the uneven shape of the existing circuit.

The above L5 value (g/mm) is obtained by dividing a load of a sample by the width of the sample, the load of the sample being a value at the time when it elongates by 5% in a tensile test at 100° C. of a film (a 10 mm wide strip-like sample) under conditions of a chuck interval of 10 cm and a pulling rate of 10 cm/min Although a film having the above L5 values can be obtained under the same stretching conditions as a biaxially oriented film having the above plane orientation coefficient, the above film can be obtained particularly when the unstretched film formed from the polyester composition of the present invention is biaxially stretched to 3.0 to 3.6 times in longitudinal and transverse directions at a temperature of 100 to 145° C. and heat-set at 170 to 190° C. as required to adjust the thickness of the film after stretching to 5 to 50 μm, preferably 10 to 30 μm.

The thickness of the polyester film of the present invention as a supporting film is preferably 3 to 75 μm, more preferably 5 to 75 μm, particularly preferably 10 to 50 μm.

If the thickness is less than 3 μm, the film will be liable to break at the time of processing, while if the thickness is more than 75 μm, it will have excess quality and hence, economically disadvantageous.

The supporting film of the present invention may be either a single-layer film or a composite film produced by a coextrusion method so far as it has the above polymer composition and physical properties. In the case of a composite film prepared by the coextrusion method, the polymer composition is selected from the above polyester-a and a mixture of the polyester-a and the polyester-b. For example, the polymer composition may consist of a first layer of the polyester-a and a second layer of the mixture of the polyester-a and the polyester-b. The thickness ratio of the first layer to the second layer is 1:1 to 1:9, preferably 1:2 to 1:8.

For the purpose of adjusting the adhesion of the polyester film to the photoresist layer, a coating layer may be provided on the polyester film of the present invention. The coating layer may be formed during or after the production of a film. It is preferred that a coating agent is applied after stretching in a longitudinal direction and before stretching in a transverse direction in the production process of a film particularly from viewpoints of uniformity in the thickness of the coating layer and production efficiency. Illustrative examples of the coating agent include resins such as polyester, polyamide, polystyrene, polyacrylate, polycarbonate, polyarylate, polyvinyl chloride, polyvinylidene chloride, polyvinyl butyral, polyvinyl alcohol and polyurethane; copolymers and mixtures thereof; and the like. However, the present invention is not limited to these. In the present invention, other polymer (such as polyethylene, polystyrene, polycarbonate, polysulfone, polyphenylene sulfide, polyamide or polyimide) may be contained in an amount of 1% by weight based on the total weight of the polymer composition for use in the production of a film. Additives such as antioxidant, thermal stabilizer, antistatic agent, lubricant, dye, pigment and the like may also be added as required.

A photoresist film laminate [I] is formed by laminating a photoresist layer on one side of the supporting film of the present invention and a protective film on the opposite side of the supporting film. A photoresist film laminate [II] consisting of a photoresist supporting film, a photoresist layer and a conductive substrate is formed by removing the protective film from the photoresist film laminate [I] and laminating the photoresist film laminate [I] on the conductive substrate in such a manner that the substrate and the photoresist layer are in contact with each other.

These photoresist film laminates [I] and [II] by themselves are known and widely used. However, the flexibility which can fit the uneven surface of a printed circuit and resolution are improved by using the supporting film of the present invention in the photoresist film laminates [I] and [II].

Therefore, a generally known photoresist layer, protective film and conductive substrate can be used for a photoresist.

A brief description is subsequently given of their compositions and properties. Generally used ones are acceptable and not limited by the following description.

Photoresist layer:

The photoresist layer is a layer which is cured when it is exposed to visible light or ultraviolet light and formed from a composition comprising a carboxyl group-containing binder polymer, a photopolymerization initiator and a polymerizable vinyl compound. Examples of the carboxyl group-containing binder polymer include acrylic acid alkyl ester, methacrylic acid alkyl ester, acrylic acid, methacrylic acid or a vinyl group-containing compound copolymerizable with these. Examples of the photopolymerization initiator are an aromatic ketone such as benzophenone, Michler's ketone or the like. Examples of the polymerizable vinyl compound are polyethylene glycol diacrylate, polypropylene glycol diacrylate and the like.

The composition constituting a photoresist layer may contain a plasticizer, a thermal polymerization inhibitor, a dye, a pigment, a filler, an adhesion imparting agent, a photo-coloring agent, a flame retardant and the like as required.

The thickness of the photoresist layer is preferably 10 to 100 μm, more preferably 15 to 75 μm.

The photoresist layer is cured under irradiation from a light source such as an ultra-high pressure mercury lamp.

Protective film:

The protective film is aimed to protect the surface of the photoresist layer from dust and flaws and is removed from the photoresist layer of a photoresist film laminate [I] when a photoresist film laminate [II] is formed from the photoresist film laminate [I] and the conductive substrate.

The material, color and thickness of a film for forming the protective film are not limited to any particular ones so long as the film is effective in protecting the surface of a photoresist layer from dust and flaws. A polyethylene film or a polyester film having a thickness of 10 to 100 μm is preferred.

Conductive substrate:

The conductive substrate is a laminate consisting of an insulating base material such as an epoxy resin or phenol resin and a conductive thin film such as a copper thin film formed on the base material or a metal sheet such as a copper or iron sheet, and serves to mount electronic devices such as LSI and the like. The thickness of the conductive substrate is preferably 0.1 to 2.0 mm.

EXAMPLES

The following examples are given to further illustrate the present invention.

In the examples, the measurement and evaluation of physical properties were carried out as follows.

1. plane orientation coefficient

Using an Abbe refractometer of which to an eyepiece side a polarization analyzer was attached and methylene iodide as a mount solution, a refractive index (nx) in a transverse direction, refractive index (ny) in a longitudinal direction and refractive index (nz) in a thickness direction of a film were measured with monochromatic NaD rays at a measurement temperature of 25° C., and a plane orientation coefficient (f) is obtained from the following equation.

$$f=[(nx+ny)/2]-nz$$

2. L5 value

A tensile test on a film (a 10 mm wide strip-like sample) was carried out at 100° C. at a chuck interval of 10 cm, and a pulling rate of 10 cm/min, using a Tensilon universal tensile tester manufactured by Toyo Baldwin Co., Ltd., to which a thermostatic chamber was attached, and a load when the sample elongates by 5% was obtained. The value obtained by dividing the load by the width of the sample is taken as an L5 value (g/mm).

[Evaluation of flexibility which can fit unevenness of the print circuit surface and resistance to pin hole]

A film is laminated on the surface of a copper sheet heated at 100° C. and having 100 μm wide, 15 μm deep and 5 mm long grooves which are arranged in parallel to one another at intervals of 20 μm, and this film-laminated copper sheet is observed through a microscope and evaluated based on the following criteria(3) and (4).

3. Flexibility which can fit unevenness of the print circuit surface (In Table, this property is referred to simply as "Flexibility").

○: The distance from the bottom of each groove formed in the copper sheet to the top surface of the film on the copper sheet side is 0.1 μm or less. (good flexibility)

X: The distance from the bottom of each groove formed in the copper sheet to the top surface of the film on the copper sheet side is more than 0.1 μm (poor flexibility)

4. resistance to pin hole

○: No pin holes having a diameter of 0.1 μm or more are observed in the film covering the grooves of the copper sheet. (good resistance to pin hole)

X: Pin holes having a diameter of 0.1 μm or more are observed in the film covering the grooves of the copper sheet. (poor resistance to pin hole)

[Evaluation of practicability of photoresist film]

A photoresist layer is formed on one side of a film and a polyethylene film is laminated on the photoresist layer as a protective layer to prepare a photoresist film laminate. A printed circuit is fabricated using the thus obtained photoresist film laminate. In other words, a photoresist layer of the photoresist film from which the protective layer has been removed is joined to a copper sheet formed on a glass fiber-containing epoxy resin substrate. Then, a glass sheet having a printed circuit is joined to the photoresist film and exposed to ultraviolet light from the side of the glass sheet. Thereafter, the film is peeled off and the laminate is subjected to a set of development operations such as washing, etching and the like to form a circuit. The thus obtained circuit is observed visually or through a microscope. The practicability of the photoresist film laminate is evaluated based on the following criteria (5) and (6).

5. resolution

○: The photoresist film laminate has extremely high resolution and a clear circuit is observed (good resolution)

X: The photoresist film laminate has poor resolution and cannot be used in a high-density circuit. (poor resolution)

6. resistance to circuit defect

○: No missing parts are observed in the circuit (good resistance to defect of circuit)

Δ: Missing parts are seldom observed in the circuit. (slightly good resistance to defect of circuit)

X: Missing parts are observed in the circuit and the circuit cannot be used practically. (poor resistance to defect of circuit)

Examples 1 to 5 and Comparative Examples 1 and 2

Copolyethylene terephthalates (intrinsic viscosity of 0.60) containing 0.1% by weight of spherical monodisperse silica having an average particle size of 1.5 μm (particle diameter ratio of 1.07 and relative standard deviation of 0.1) and having, as a copolymer component, components shown in Table 1 were melt extruded at a temperature shown in Table 2 and quenched to solidify to obtain unstretched films.

Thereafter, the unstretched films were stretched in a longitudinal direction and a transverse direction under conditions shown in Table 2 and heat-set at 180° C. to obtain 25 μm-thick biaxially oriented films. The properties of these films are shown in Table 3.

Example 6

Copolyethylene terephthalate (intrinsic viscosity of 0.60) containing a lubricant shown in Table 1 and 12 mol % of isophthalic acid were melt extruded at 280° C. and quenched to solidify to obtain an unstretched film. A biaxially oriented film was obtained in the same manner as in Example 1 except that the unstretched film was stretched to 3.0 times in a longitudinal direction at 110° C. and to 3.0 times in a transverse direction at 120° C. sequentially and heat-set at 180° C. The properties of this film are shown in Table 3.

Comparative Example 3

Copolyethylene terephthalate (melting point of 228° C., intrinsic viscosity of 0.60) containing 0.1% by weight of spherical monodisperse silica having an average particle size of 1.5 μm (particle diameter ratio of 1.07, relative standard deviation of 0.1) and 12 mol % of isophthalic acid were melt extruded at 280° C. and quenched to solidify to obtain an unstretched film. Thereafter, the unstretched film was stretched in longitudinal and transverse directions under conditions shown in Table 2 and heat-set at 180° C. to obtain a biaxially oriented film. The properties of this film are shown in Table 3.

Examples 7 to 11 and Comparative Example 4

Biaxially oriented films having thicknesses and plane orientation coefficients shown in Table 5 were obtained in the same manner as in Example 1 except that copolyesters shown in Table 4 were used, the thickness of the unstretched film was changed by melt extrusion conditions, and the unstretched films were stretched under conditions shown in Table 5. The properties of the films and the results of evaluation on the practicability of the photoresist films are shown in Table 6.

TABLE 1

|  | Polyester | | | Lubricant | | |
| --- | --- | --- | --- | --- | --- | --- |
|  | Copolymer component | Proportion (mol %) | Melting point (° C.) | Kind | Average particle size (μm) | Proportion (wt %) |
| Ex. 1 | Isophthalic acid | 9 | 235 | Spherical silica | 1.5 | 0.1 |
| Ex. 2 | Isophthalic acid | 12 | 228 | Spherical silica | 1.5 | 0.1 |
| Ex. 3 | Isophthalic acid | 15 | 222 | Spherical silica | 1.5 | 0.1 |
| Ex. 4 | Isophthalic acid | 18 | 215 | Spherical silica | 1.5 | 0.1 |
| Ex. 5 | Sebacic acid | 12 | 229 | Spherical silica | 1.5 | 0.1 |
| Ex. 6 | Isophthalic acid | 12 | 229 | Titanium dioxide | 0.3 | 0.3 |
| Comp. Ex. 1 | None | 0 | 260 | Spherical silica | 1.5 | 0.1 |
| Comp. Ex. 2 | Isophthalic acid | 22 | 208 | Spherical silica | 1.5 | 0.1 |
| Comp. Ex. 3 | Isophthalic acid | 12 | 228 | Spherical silica | 1.5 | 0.1 |

Ex.: Example
Comp. Ex.: Comparative Example

TABLE 2

|  | Melt-extrusion temperature (° C.) | Stretching condition in longitudinal direction | | Stretching condition in transverse direction | |
| --- | --- | --- | --- | --- | --- |
|  |  | Temperature (° C.) | Stretch ratio | Temperature (° C.) | Stretch ratio |
| Ex. 1 | 290 | 110 | 3.0 | 130 | 3.1 |
| Ex. 2 | 280 | 110 | 3.0 | 130 | 3.1 |
| Ex. 3 | 275 | 110 | 3.0 | 130 | 3.1 |
| Ex. 4 | 270 | 105 | 3.0 | 125 | 3.1 |
| Ex. 5 | 280 | 90 | 3.0 | 110 | 3.1 |
| Ex. 6 | 280 | 110 | 3.0 | 120 | 3.0 |
| Comp. Ex. 1 | 295 | 115 | 3.0 | 135 | 3.1 |
| Comp. Ex. 2 | 265 | 105 | 3.0 | 125 | 3.1 |
| Comp. Ex. 3 | 280 | 90 | 3.8 | 90 | 3.0 |

Ex.: Example
Comp. Ex.: Comparative Example

TABLE 3

|  | Film characteristics | | | Evaluation of practicability of photoresist film | | |
| --- | --- | --- | --- | --- | --- | --- |
|  | Plane orientation coefficient | Flexibility | Resistance to pin hole | Resolution | Resistance to circuit defect | Overall evaluation |
| Ex. 1 | 0.140 | ◯ | ◯ | ◯ | ◯ | ◯ |
| Ex. 2 | 0.127 | ◯ | ◯ | ◯ | ◯ | ◯ |
| Ex. 3 | 0.115 | ◯ | ◯ | ◯ | ◯ | ◯ |
| Ex. 4 | 0.098 | ◯ | ◯ | ◯ | ◯ | ◯ |
| Ex. 5 | 0.124 | ◯ | ◯ | ◯ | ◯ | ◯ |

TABLE 3-continued

|  | Film characteristics | | | Evaluation of practicability of photoresist film | | |
|---|---|---|---|---|---|---|
|  | Plane orientation coefficient | Flexibility | Resistance to pin hole | Resolution | Resistance to circuit defect | Overall evaluation |
| Ex. 6 | 0.129 | ○ | ○ | ○ | ○ | ○ |
| Comp. Ex. 1 | 0.171 | X | Not measured | ○ | X | X |
| Comp. Ex. 2 | 0.085 | ○ | X | ○ | Δ | X |
| Comp. Ex. 3 | 0.165 | X | Not measured | ○ | X | X |

Ex.: Example
Comp. Ex.: Comparative Example

TABLE 4

|  | Polyester | | | Lubricant | | |
|---|---|---|---|---|---|---|
|  | Copolymer component | Proportion (mol %) | Melting point (° C.) | Kind | Average particle size (μm) | Proportion (wt %) |
| Ex. 7 | Isophthalic acid | 3 | 250 | Spherical silica | 1.5 | 0.1 |
| Ex. 8 | Isophthalic acid | 12 | 228 | Spherical silica | 1.5 | 0.1 |
| Ex. 9 | Isophthalic acid | 15 | 222 | Spherical silica | 1.5 | 0.1 |
| Ex. 10 | Isophthalic acid | 3 | 250 | Spherical silica | 1.5 | 0.1 |
| Ex. 11 | Isophthalic acid | 12 | 228 | Spherical silica | 1.5 | 0.1 |
| Comp. Ex. 4 | None | (Homo-PET) | 260 | Spherical silica | 1.5 | 0.1 |

Ex.: Example
Comp. Ex.: Comparative Example
PET: Polyethylene terephthalate

TABLE 5

|  | Melt extrusion | Stretching condition in longitudinal direction | | Stretching condition in transverse direction | | Film characteristics | |
|---|---|---|---|---|---|---|---|
|  | Temperature (° C.) | Temperature (° C.) | Stretch ratio | Temperature (° C.) | Stretch ratio | Thickness (μm) | Plane orientation coefficient |
| Ex. 7 | 295 | 115 | 3.0 | 135 | 3.1 | 10 | 0.127 |
| Ex. 8 | 280 | 110 | 3.2 | 130 | 3.4 | 5 | 0.145 |
| Ex. 9 | 275 | 110 | 3.0 | 130 | 3.1 | 30 | 0.128 |
| Ex. 10 | 295 | 115 | 3.6 | 135 | 3.8 | 10 | 0.149 |
| Ex. 11 | 280 | 110 | 3.2 | 130 | 3.4 | 20 | 0.144 |
| Comp. Ex. 4 | 295 | 115 | 2.9 | 135 | 3.0 | 10 | 0.170 |

Ex.: Example
Comp. Ex.: Comparative Example

TABLE 6

|  | Film characteristics | | | | |
|---|---|---|---|---|---|
|  | L5 value (g/mm) | | | Film evaluation | |
|  | Longitudinal direction | Transverse direction | Average value | Flexibility | Resistance to circuit defect |
| Ex. 7 | 53 | 48 | 50.5 | ○ | ○ |
| Ex. 8 | 15 | 14 | 14.5 | ○ | ○ |
| Ex. 9 | 54 | 54 | 54.0 | ○ | ○ |
| Ex. 10 | 65 | 58 | 61.5 | ○ | Δ |
| Ex. 11 | 59 | 56 | 57.5 | ○ | Δ |
| Comp. Ex. 4 | 68 | 56 | 62.0 | X | X |

Ex.: Example
Comp. Ex.: Comparative Example

It is evident from the results of Table 3 and Table 6 that the films of Examples are superior in all of flexibility, resistance to pin hole, resolution and resistance to circuit defect.

Examples 12 to 17 and Comparative Examples 5 to 10

Copolyesters (to be abbreviated as co-PET hereinafter) which were mainly composed of polyethylene terephthalate containing, as a copolymer component, components shown in Table 7 and contained 0.1% by weight of spherical monodisperse silica having an average particle size of 1.5 μm (particle diameter ratio of 1.07, relative standard deviation of 0.1) and polybutylene terephthalate (to be abbreviated as PBT hereinafter) or copolyesters (to be abbreviated as "co-PBT" hereinafter) mainly composed of polybutylene terephthalate containing, as a copolymer component, components shown in Table 7 were blended in proportions shown in Table 7, and the resulting blends were melt extruded at 280° C. and quenched to obtain unstretched films.

Thereafter, the unstretched films were stretched in a longitudinal direction under conditions shown in Table 8 and then stretched in a transverse direction and heat-set at 180° C. to obtain biaxially oriented films having a thickness and a plane orientation coefficient shown in Table 8. The properties of these films and the results of evaluation on the practicability of photoresist films are shown in Table 9.

Example 18

A biaxially oriented film having a thickness of 10 μm and a plane orientation coefficient of 0.088 was obtained in the same manner as in Example 16 except that 0.3% by weight of titanium dioxide having an average particle size of 0.3 μm was added in place of 0.1% by weight of spherical monodisperse silica having an average particle size of 1.5 μm. The properties of this film and the result of evaluation on the practicability of a photoresist film are shown in Table 9.

Comparative Example 11

A biaxially oriented film having a thickness of 10 μm and a plane orientation coefficient of 0.089 was obtained in the same manner as in Example 16 except that 0.05% by weight of bulk silica having an average particle size of 2.7 μm was added in place of 0.1% by weight of spherical monodisperse silica having an average particle size of 1.5 μm. The properties of this film and the result of evaluation on the practicability of a photoresist film are shown in Table 9.

Examples 19 to 21

Biaxially oriented films having a thickness and a plane orientation coefficient shown in Table 11 were obtained in the same manner as in Example 12 except that polyesters shown in Table 10 were used, the thickness of unstretched film was changed by melt extrusion conditions, and stretching was carried out under conditions shown in Table 11. The properties of these films and the results of evaluation on the practicability of photoresist films are shown in Table 12.

TABLE 7

| | co-PET | | | | PBT or co-PBT | | | |
|---|---|---|---|---|---|---|---|---|
| | Copolymer component | Proportion (mol %) | Melting point (° C.) | Blend ratio (wt %) | Copolymer component | Proportion (mol %) | Melting point (° C.) | Blend ratio (wt %) |
| Ex. 12 | SA | 9 | 235 | 99 | (PBT homopolymer) | | 223 | 1 |
| Ex. 13 | SA | 9 | 235 | 90 | IA | 10 | 205 | 10 |
| Ex. 14 | SA | 12 | 228 | 85 | (PBT homopolymer) | | 223 | 15 |
| Ex. 15 | IA | 9 | 235 | 85 | IA | 5 | 214 | 15 |
| Ex. 16 | IA | 12 | 228 | 75 | (PBT homopolymer) | | 223 | 25 |
| Ex. 17 | IA | 3 | 249 | 55 | (PBT homopolymer) | | 223 | 45 |
| Comp. Ex. 5 | IA | 3 | 249 | 50 | (PBT homopolymer) | | 223 | 50 |
| Comp. Ex. 6 | IA | 1 | 252 | 75 | (PBT homopolymer) | | 223 | 25 |
| Comp. Ex. 7 | IA | 22 | 208 | 75 | (PBT homopolymer) | | 223 | 25 |
| Comp. Ex. 8 | IA | 12 | 228 | 85 | (PBT homopolymer) | | 223 | 15 |
| Comp. Ex. 9 | IA | 12 | 228 | 85 | (PBT homopolymer) | | 223 | 15 |
| Comp. Ex. 10 | IA | 9 | 235 | 85 | IA | 25 | 178 | 15 |

Ex.: Example, Comp. Ex.: Comparative Example
PET: Polyethylene terephthalate, PBT: Polybutylene terephthalate
IA: Isophthalic acid, SA: Sebacic acid

TABLE 8

| | Stretching condition in longitudinal direction | | Stretching condition in transverse direction | | Film characteristics | |
|---|---|---|---|---|---|---|
| | Temperature (° C.) | Stretch ratio | Temperature (° C.) | Stretch ratio | Thickness (μm) | Plane orientation coefficient |
| Ex. 12 | 120 | 3.0 | 120 | 3.2 | 25 | 0.125 |
| Ex. 13 | 115 | 3.1 | 115 | 3.1 | 25 | 0.137 |
| Ex. 14 | 125 | 3.0 | 125 | 3.2 | 5 | 0.085 |
| Ex. 15 | 90 | 3.1 | 90 | 3.1 | 20 | 0.157 |
| Ex. 16 | 110 | 3.0 | 110 | 3.1 | 10 | 0.117 |
| Ex. 17 | 100 | 3.0 | 100 | 3.1 | 25 | 0.121 |
| Comp. Ex. 5 | 95 | 3.0 | 95 | 3.0 | 25 | 0.124 |
| Comp. Ex. 6 | 120 | 3.0 | 120 | 3.1 | 10 | 0.120 |
| Comp. Ex. 7 | 95 | 3.0 | 95 | 3.1 | 10 | 0.113 |
| Comp. Ex. 8 | 90 | 3.0 | 90 | 3.1 | 5 | 0.165 |
| Comp. Ex. 9 | 130 | 3.0 | 130 | 3.2 | 5 | 0.075 |
| Comp. Ex. 11 | 105 | 3.1 | 105 | 3.0 | 20 | 0.125 |

Ex.: Example
Comp. Ex.: Comparative Example

TABLE 9

| | Film characteristics | | Evaluation of practicability of photoresist film | | |
|---|---|---|---|---|---|
| | Flexibility | Resistance to pin hole | Resolution | Resistance to circuit defect | Overall evaluation |
| Ex. 12 | ○ | ○ | ○ | ○ | ○ |
| Ex. 13 | ○ | ○ | ○ | ○ | ○ |
| Ex. 14 | ○ | ○ | ○ | ○ | ○ |
| Ex. 15 | ○ | ○ | ○ | ○ | ○ |
| Ex. 16 | ○ | ○ | ○ | ○ | ○ |
| Ex. 17 | ○ | ○ | ○ | ○ | ○ |
| Ex. 18 | ○ | ○ | ○ | ○ | ○ |
| Comp. Ex. 5 | ○ | X | ○ | Δ | X |
| Comp. Ex. 6 | X | Not measured | ○ | X | X |
| Comp. Ex. 7 | ○ | X | ○ | Δ | X |
| Comp. Ex. 8 | X | Not measured | ○ | X | X |
| Comp. Ex. 9 | ○ | X | ○ | Δ | X |
| Comp. Ex. 10 | ○ | X | ○ | Δ | X |
| Comp. Ex. 11 | ○ | ○ | X | X | X |

Ex.: Example
Comp. Ex.: Comparative Example

TABLE 10

| | co-PET | | | | PBT or co-PBT | | | |
|---|---|---|---|---|---|---|---|---|
| | Copolymer component | Proportion (mol %) | Melting point (° C.) | Blend rate (wt %) | Copolymer component | Proportion (mol %) | Melting point (° C.) | Blend rate (wt %) |
| Ex. 19 | IA | 12 | 228 | 70 | (PBT homopolymer) | | 223 | 30 |
| Ex. 20 | IA | 3 | 249 | 90 | (PBT homopolymer) | | 223 | 10 |
| Ex. 21 | IA | 3 | 249 | 99 | (PBT homopolymer) | | 223 | 1 |

Ex.: Example
IA: Isophthalic acid
PBT: Polybutylene terephthalate

TABLE 11

| | Stretching condition in longitudinal direction | | Stretching condition in transverse direction | | Film characteristics | |
|---|---|---|---|---|---|---|
| | Temperature (° C.) | Stretch ratio | Temperature (° C.) | Stretch ratio | Thickness (μm) | Plane orientation coefficient |
| Ex. 19 | 110 | 3.0 | 110 | 3.1 | 5 | 0.110 |
| Ex. 20 | 115 | 3.0 | 115 | 3.1 | 10 | 0.131 |
| Ex. 21 | 115 | 3.0 | 115 | 3.2 | 10 | 0.145 |

Ex.: Example

TABLE 12

| | Film characteristics | | | | |
|---|---|---|---|---|---|
| | L5 value (g/mm) | | | Film evaluation | |
| | Longitudinal direction | Transverse direction | Average value | Flexibility | Resistance to circuit defect |
| Ex. 19 | 4 | 4 | 4.0 | ○ | ○ |
| Ex. 20 | 43 | 38 | 40.5 | ○ | ○ |
| Ex. 21 | 51 | 45 | 48.0 | ○ | Δ |

Ex.: Example

As is evident from the results of Table 9 and Table 12, the films of Examples are all excellent in flexibility, resistance to pin hole, resolution and resistance to circuit defect.

Example 22

Copolyethylene terephthalate (to be referred to as polyester composition (I) hereinafter) containing 0.1% by weight of spherical monodisperse silica (particle diameter ratio of 1.1) having an average particle size of 0.3 μm and a polyester composition (to be referred to as polyester composition (II) hereinafter) prepared by mixing a co-PET containing spherical monodisperse silica (particle diameter ratio of 1.07) having an average particle size of 1.5 μm and having, a copolymer component, components shown in Table 13 and PBT (homopolymer) in a blend ratio shown in Table 13 were separately molten at 280° C., coextruded from adjacent dies, laminated, thermally joined together and quenched to prepare an unstretched laminate film.

Thereafter, this unstretched film was stretched to 3.2 times in a longitudinal direction at 105° C. and to 3.4 times in a transverse direction at 110° C., and heat-set at 180° C. to obtain a biaxially oriented laminate film having a thickness of 10 μm. At this point, a layer of the polyester composition (I) had a thickness of 2 μm and a layer of the polyester composition (II) had a thickness of 8 μm. The properties of this film are shown in Table 14.

Further, a photoresist layer was formed on the side of the layer of the polyester composition (II) of this film and evaluation on the practicability of a photoresist film laminate was carried out in the same manner as in Example 1. The results are shown in Table 14.

Example 22

The procedure of Example 22 was repeated except that the PBT was replaced with a copolybutylene terephthalate containing a copolymer component shown in Table 13 and the blend ratio was changed as shown in Table 13. The results are shown in Table 14.

TABLE 13

| | co-PET | | | | PBT or co-PBT | | | |
| --- | --- | --- | --- | --- | --- | --- | --- | --- |
| | Copolymer component | Proportion (mol %) | Melting point (° C.) | Blend rate (%) | Copolymer component | Proportion (mol %) | Melting point (° C.) | Blend rate (%) |
| Ex. 22 | Isophthalic acid | 5 | 247 | 60 | (PBT homopolymer) | | 223 | 40 |
| Ex. 23 | Isophthalic acid | 5 | 247 | 75 | Adipic acid | 25 | 188 | 25 |

Ex.: Example
PET: Polyethylene terephthalate
PBT: Polybutylene terephthalate

TABLE 14

| | Plane orientation coefficient | | L5 value (g/mm) | | | | | Evaluation on practicability of photoresist film | | |
| --- | --- | --- | --- | --- | --- | --- | --- | --- | --- | --- |
| | Polyester composition (I) layer side | Polyester composition (II) layer side | Longitudinal direction | Transverse direction | Average value | Flexibility | Resistance to pin hole | Resolution | Resistance to circuit defect | Overall evaluation |
| Ex. 22 | 0.128 | 0.132 | 20 | 18 | 19.0 | ○ | ○ | ○ | ○ | ○ |
| Ex. 23 | 0.130 | 0.120 | 16 | 15 | 15.5 | ○ | ○ | ○ | ○ | ○ |

Ex.: Example

What is claimed is:

1. A photoresist film laminate comprising
   (1) a protective film,
   (2) a photoresist layer and
   (3) a photoresist supporting film
      (A) formed from a polymer composition comprising
         (i) 55 to 100% by weight of a copolyester containing ethylene terephthalate units as a main recurring unit and having a melting point of 210 to 250° C. and
         (ii) 0 to 45% by weight of polybutylene terephthalate or a copolyester containing butylene terephthalate units as a main recurring unit and having a melting point of not lower than 180° C., and
      (B) having a plane orientation coefficient of 0.08 to 0.16, which are laminated in order listed above.

2. The photoresist film laminate of claim 1, wherein the polymer composition contains 0.001 to 0.5% by weight of a lubricant having an average particle size of not more than 2.5 μm.

3. The photoresist film laminate of claim 1 values in the longitudinal and transverse directions in the range of 1 to 65 g/mm.

4. The photoresist film laminate of claim 1 which has a plane orientation coefficient of 0.10 to 0.15.

5. The photoresist film laminate of claim 1 which has a thickness of 3 to 75 μm.

6. The photoresist film laminate of claim 1, wherein the polymer composition is a copolyester containing ethylene terephthalate as a main recurring unit and having a melting point of 215 to 235° C.

7. The photoresist film laminate of claim 1, wherein the polymer composition comprises (i) 55 to 99% by weight of a copolyester containing ethylene terephthalate units as a main recurring unit and having a melting point of 210 to 250° C. and (ii) 1 to 45% by weight of polybutylene terephthalate or a copolyester containing butylene terephthalate units as a main recurring unit and having a melting point of not lower than 180° C.

8. A photoresist film laminate comprising
   (i) a photoresist supporting film
      (A) formed from a polymer composition comprising
         (i) 55 to 100% by weight of a copolyester containing ethylene terephthalate, units as a main recurring unit and having a melting point of 210 to 250° C. and
         (ii) 0 to 45% by weight of polybutylene terephthalate or a copolyester containing butylene terephthalate units as a main recurring unit and having a melting point of not lower than 180° C., and
      (B) having a plane orientation coefficient of 0.08 to 0.16,
   (ii) a photoresist layer and
   (iii) a conductive substrate,
   which are laminated in order listed above.

9. The photoresist film laminate of claim 8, wherein the polymer composition contains 0.001 to 0.5% by weight of a lubricant having an average particle size of not more than 2.5 μm.

10. The photoresist film laminate of claim 8, which has L5 values in the longitudinal and transverse directions in the range of 1 to 65 g/mm.

11. The photoresist film laminate of claim 8, which has a plane orientation coefficient of 0.10 to 0.15.

12. The photoresist film laminate of claim 8, which has a thickness of 3 to 75 μm.

13. The photoresist film laminate of claim 8, wherein the polymer composition is a copolyester containing ethylene terephthalate as a main recurring unit and having a melting point of 215 to 235° C.

14. The photoresist film laminate of claim 8, wherein the polymer composition comprises (i) 55 to 99% by weight of a copolyester containing ethylene terephthalate units as a main recurring unit and having a melting point of 210 to 250° C. and (ii) 1 to 45% by weight of polybutylene terephthalate or a copolyester containing butylene terephthalate units as a main recurring unit and having a melting point of not lower than 180° C.

\* \* \* \* \*